(12) United States Patent
Reuhman-Huisken et al.

(10) Patent No.: US 7,410,735 B2
(45) Date of Patent: Aug. 12, 2008

(54) METHOD OF CHARACTERIZATION, METHOD OF CHARACTERIZING A PROCESS OPERATION, AND DEVICE MANUFACTURING METHOD

(75) Inventors: Maria Elisabeth Reuhman-Huisken, Waalre (NL); Christianus Gerardus Maria De Mol, Son en Breugel (NL); Hoite Pieter Theodoor Tolsma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 645 days.

(21) Appl. No.: 10/844,572

(22) Filed: May 13, 2004

(65) Prior Publication Data

US 2005/0031975 A1 Feb. 10, 2005

(30) Foreign Application Priority Data

May 13, 2003 (EP) .................................. 03252966

(51) Int. Cl.
*G03F 9/00* (2006.01)
*G03C 5/00* (2006.01)

(52) U.S. Cl. ........................... 430/22; 430/30; 382/144; 382/145

(58) Field of Classification Search .................. 430/22, 430/30; 382/144, 145
See application file for complete search history.

(56) References Cited

U.S. PATENT DOCUMENTS

| | | | |
|---|---|---|---|
| 5,252,414 A | 10/1993 | Yamashita et al. | |
| 5,863,680 A | 1/1999 | Kawakubo et al. | |
| 6,699,627 B2 * | 3/2004 | Smith et al. | .................. 430/22 |
| 2002/0080364 A1 | 6/2002 | Monshouwer et al. | |
| 2002/0102482 A1 | 8/2002 | Smith et al. | |
| 2004/0126004 A1 | 7/2004 | Kikuchi | |

FOREIGN PATENT DOCUMENTS

| | | |
|---|---|---|
| EP | 0 794 465 A2 | 9/1997 |
| EP | 0794465 A2 | 9/1997 |
| JP | 9-246151 | 9/1997 |
| JP | 2001-176769 | 6/2001 |
| JP | 2002-353121 | 12/2002 |

OTHER PUBLICATIONS

European Search Reported dated Apr. 1, 2004.
Translation of office action for JP Appl. No. 2004-142011 issued Jun. 27, 2007.
Singapore Written Opinion dated Oct. 2, 2008 on Singapore Application No. 2004-024470.
Japanese Patent Application No. 2004/142011, dated Dec. 14, 2007 on Japanese Application No. 2004-142011.

* cited by examiner

*Primary Examiner*—Christopher G Young
(74) *Attorney, Agent, or Firm*—Pillsbury Winthrop Shaw Pittman LLP

(57) ABSTRACT

A system in which deformation of a substrate wafer is monitored during processing of the wafer is disclosed. In one embodiment, the distortion in the substrate wafer is measured after each exposure and processing operation by comparing the position of a plurality of reference marks to values in a database.

31 Claims, 2 Drawing Sheets

METHOD OF CHARACTERIZATION, METHOD OF CHARACTERIZING A PROCESS OPERATION, AND DEVICE MANUFACTURING METHOD

RELATED APPLICATIONS

This application claims benefit of European Patent Application No. 03252966.1, filed May 13, 2003, which document is hereby incorporated by reference.

FIELD OF THE INVENTION

The present invention relates to methods of characterization, methods of characterizing a process operation, and device manufacturing methods using a lithographic apparatus.

DESCRIPTION OF RELATED ART

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

Manufacturing a typical device by a lithographic process typically includes a plurality of cycles each of several operations. These operations may include coating the substrate with a photosensitive material (or otherwise applying a photosensitive material to one or more surfaces of the substrate), projecting an image on the photosensitive material, developing the photosensitive material and processing the substrate, which can include covering the substrate in a new layer of material. One of the problems that may be encountered with the lithographic process is that successive layers are not accurately imaged on top of each other so that there is a so-called overlay error. In order to avoid proceeding onto the subsequent operations when an overlay error already exists which would be detrimental to the component's performance, after each cycle the overlay error may be measured. If the overlay error is too large then the most recent layer can be removed and that cycle repeated before proceeding onto the next cycle.

In order to minimize the overlay errors, substrates may be provided with a plurality of reference marks so that the position of the substrate on a substrate table in a projection apparatus may be measured very precisely prior to the exposure operation. In this way it is possible to maximize the accuracy of the exposure operation because the relative positions of the substrate, the previously applied patterned layer and the mask in the lithographic apparatus are known.

Another problem with multi-cycle lithographic processes is the deformation of the substrate which can occur with the application of particular layers and/or particular patterns. Deformation includes, for example, topographic 3-dimensional deformation, deformation of the reference marks (shape or depth) or variation of layer properties or thicknesses deposited on the wafer. Chemical mechanical polishing (CMP) is notorious for causing deformation of the substrate. With the use of substrate wafers with a diameter of 300 mm or more, it is expected that wafer deformation will become an even more important factor. In order to minimize deformation, it may be desirable to keep the processes as uniform as possible over the whole area of the substrate. Deformation of the substrate wafer can lead to errors in the imaging of the wafer resulting in the need to repeat a particular operation. Also, during the development of a process for a particular component manufactured by lithography the process may be optimized to minimize, or at least keep within limits, the amount of substrate deformation. The reduction of overlay errors or errors as a result of substrate deformation, or at least early detection of such errors, may lead to improved yield.

SUMMARY

According to one embodiment of the invention, a method of characterizing a process operation performed on a substrate, the substrate having thereon a plurality of reference marks, comprises exposing a pattern representing a layer of functional parts of a device onto a photosensitive layer provided on the substrate to create a latent pattern and developing the latent pattern to reveal the pattern. The method also includes processing the substrate, measuring relative positions of the reference marks on the substrate, and characterizing the processing. The characterizing includes comparing a result of the measuring with reference information relating to nominal positions of the reference marks. Other embodiments include device manufacturing methods that include using patterning structure to impart a beam of radiation with a pattern in its cross-section, the pattern including alignment marks and functional parts of a device layer, and projecting the patterned beam onto a target portion of the substrate to form the latent pattern.

A method of characterization according to another embodiment of the invention includes creating a latent pattern in a photosensitive layer provided on a substrate, including exposing a pattern onto the photosensitive layer, and developing the latent pattern. Subsequent to the developing, the method includes processing the substrate, measuring positions of a plurality of reference marks on the substrate, and obtaining a characterization of the processing. The characterization is based on a distance between nominal positions of the reference marks and the measured positions. Other embodiments include device manufacturing methods and data storage media including sets of machine-executable instructions describing such methods.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
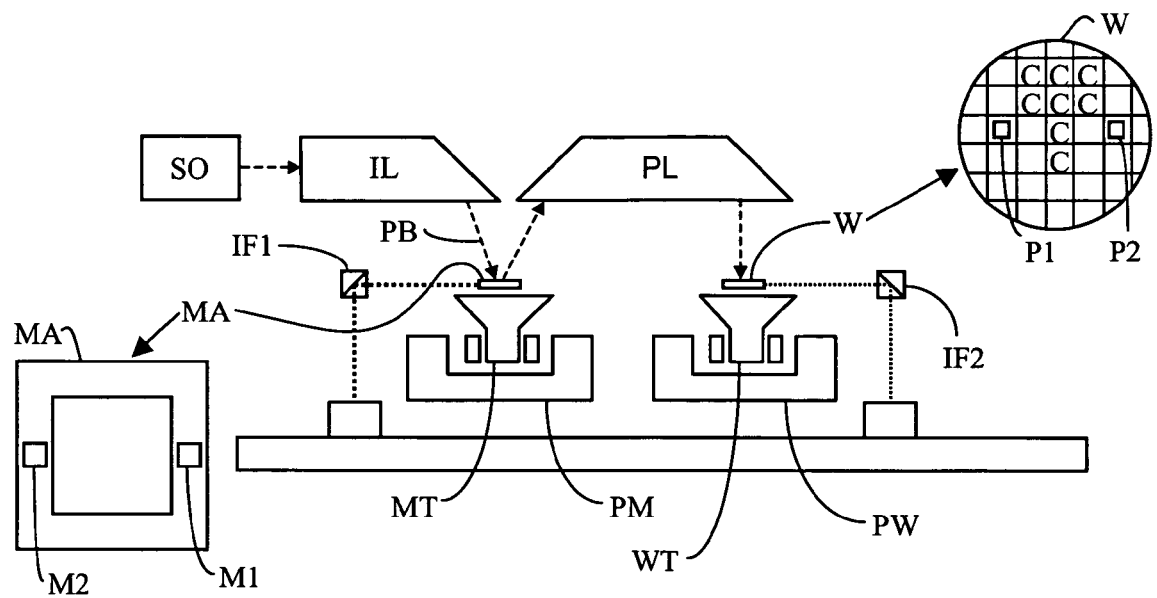
FIG. 1 depicts a lithographic projection apparatus according to an embodiment of the invention.

Embodiments of the present invention include device manufacturing methods which improve yield.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning structure, the support structure may be a frame or table, for example, which may be fixed or movable as required and which may ensure that the patterning means is at a desired position, for example with respect to the projection system. Any use of the terms "reticle" or "mask" herein may be considered synonymous with the more general term "patterning structure."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory operations may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In European Patent Publication EP 0 794 465 A2, the inventors find description of a lithographic method in which an alignment correction value is derived from overlay measurements made on a selection of wafers from a lot and used in the exposure of other wafers in the same or a subsequent lot.

In U.S. Published Patent Application No. 2002/012482 A1, the inventors find description of a method for manufacturing and using reference wafers in a fab to determine wafer stage registration performance.

In U.S. Pat. No. 5,252,414, the inventors find description of a method of evaluating a resist coating in which a second resist layer is applied on top of a first patterned resist layer. Overlay accuracy between patterns in the first and second resist layer gives a quantitative evaluation of the resist coating.

In U.S. Pat. No. 5,863,680, the inventors find description of a device manufacturing method in which information relating overlay errors between earlier process layers and exposure conditions is used to correct the alignment of subsequent layers.

FIG. 1 schematically depicts a lithographic apparatus according to a particular embodiment of the invention. The apparatus comprises:

an illumination system (illuminator) IL for providing a projection beam PB of radiation (e.g. UV or EUV radiation).

a first support structure (e.g. a mask table) MT for supporting patterning structure (e.g. a mask) MA and connected to first positioning device PM for accurately positioning the patterning structure with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a reflective projection lens) PL for imaging a pattern imparted to the projection beam PB by patterning structure MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting structure for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device or devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
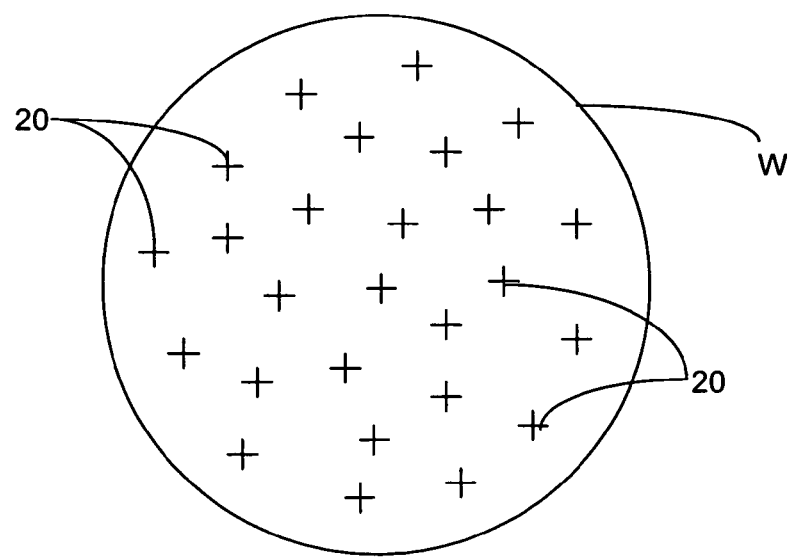
FIG. 2 depicts a substrate wafer with a typical pattern of reference marks.

FIG. 2 illustrates, in plan, a substrate W with a plurality of reference marks 20 which have been applied on the upper surface. In a dual stage lithographic projection apparatus the number of reference marks 20 might be in the region of 25 per substrate W. There is plenty of time in the measurement operation when using such apparatus for the precise measurement of the relative positions of each of the reference marks 20 on the substrate W.

Figure 3:
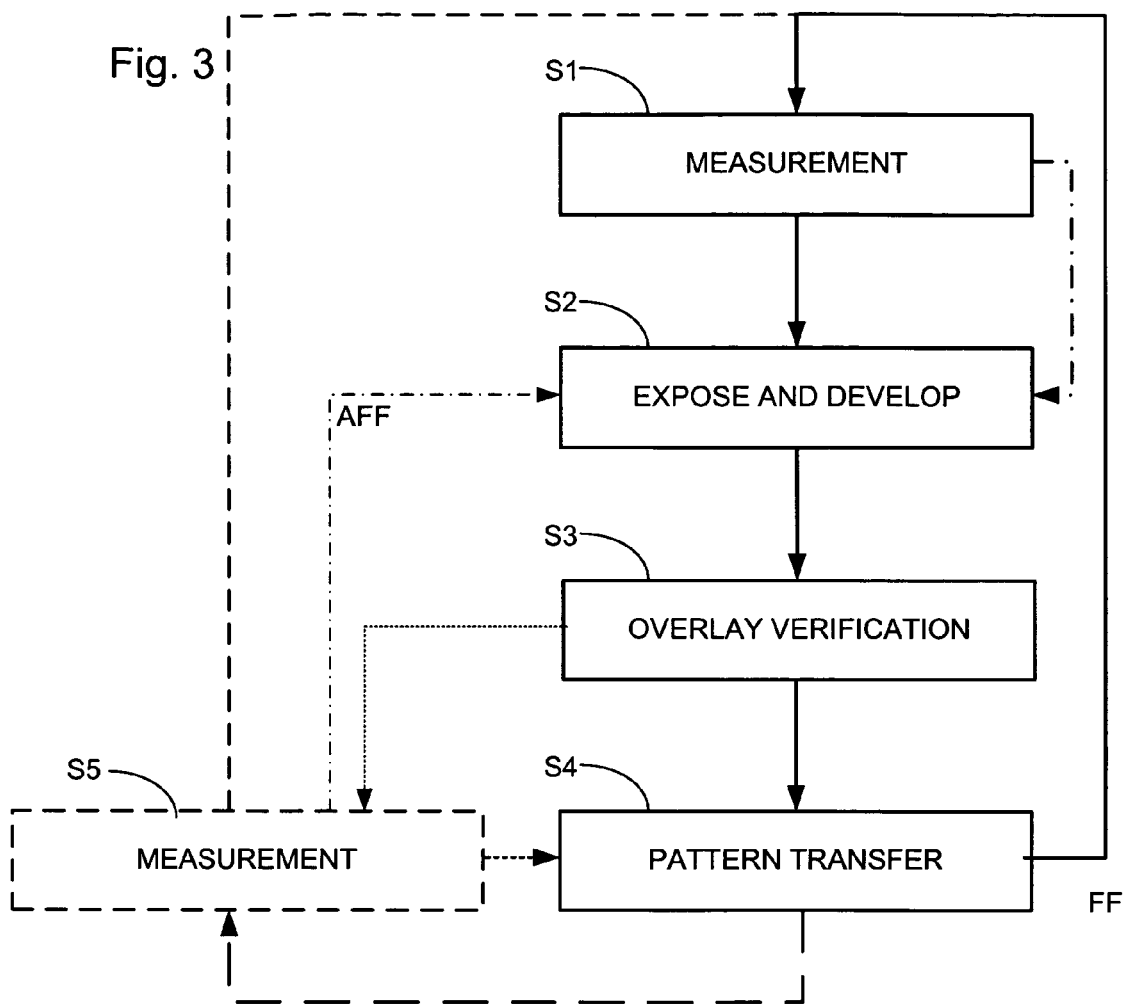
FIG. 3 is a schematic illustration showing various operations of a method according to an embodiment of the invention.

FIG. 3 illustrates the operations of the method. The first operation of the method is a measurement operation S1, in which the relative positions of each of some or all of the reference marks 20 on the substrate W are measured. This operation can be performed in the lithographic projection apparatus, where the position of the reference marks 20 may be measured in any case for substrate W to substrate table WT alignment and leveling measurement, or it can be performed in a separate machine. The machine used in the measurement operation S1 could be the same machine that is used for overlay verification which measures the alignment between two consecutive layers on the substrate W. This overlay verification operation S3 will be described later.

During the measurement operation S1 a measuring system measures the relative positions of the plurality of reference marks 20 on the substrate W under the control of a controller. A processor is used to compare the results of the measurement S1 with information/values in a database.

Several variations of the method are possible depending on the results of the comparison between the measured results with the information stored in the database. For example, an operator alerter may be activated if the comparison reveals that the substrate W is deformed beyond predetermined limits. Or alternatively the result of the comparison may be used by the controller to control the subsequent exposure of the substrate W. In either case, the result of the measurement operation and the result of the comparing operation may be automatically saved in the database to help build up a history of how the substrate deformation changes during its processing and added to the information. This is useful both as a history for that particular substrate as well as for use in comparing how different substrates have deformed over time.

Following the measurement operation S1 the wafer is exposed in a lithographic projection apparatus and is subsequently developed (operation S2 in FIG. 3). Usually the reference marks 20 are uncovered at the end of the exposure and development operation S2 (or may remain covered if visible through the overlying layers) such that further measurement may be performed using those reference marks 20, including overlay verification S3 in which the overlay accuracy is assessed. 1

The next operation, S4, is a pattern transfer operation which can involve the deposition of a layer on, or doping (by, for example, ion radiation) or etching of, areas of the substrate not covered by photosensitive material (i.e. removed during development). Before the next exposure in the lithographic projection apparatus the position and orientation of the substrate W may be measured using the reference marks 20 relative to the support structure which supports the patterning structure (which itself serves to pattern a projection beam generated by a radiation system to a desired pattern). The projection beam may be projected by a projection system onto a target portion of the substrate W.

In one embodiment a feed forward loop FF is used to control the exposure operation of the exposure and develop operation S2 to take into account the measured deformation and the result of the comparison in operation S1.

Following the exposure and development operation S2, an alignment measurement operation S3 is performed in which the alignment of two subsequent layers deposited on the substrate W during consecutive cycles is measured. This process ensures that, should the alignment of the latest layer to its preceding layer be unsatisfactory, that latest layer can be removed and a new layer deposited so that no unnecessary effort is expended in applying further subsequent layers to the substrate W even when the detected misalignment between layers would render such a substrate useless.

FIG. 3 shows an alternative or additional measurement operation S5 in which the positions of the reference marks 20 are measured relative to each other and the results are compared to information in a database. It may be convenient in certain types of apparatus to perform the alignment measurement operation S3 and the measurement operation S5 at the same time so as to free up the lithographic projection apparatus for exposing substrates which have already been measured (shown in dotted lines). Alternatively, the measurement operation S3 may be performed after operation S4 but independently of operation S5. A feed forward control of the exposure operation S2 is also possible (labeled AFF in FIG. 3). It may then be sufficient to measure only a few of the reference marks 20 in operation S1 for aligning the position of the substrate W relative to the mask in the projection apparatus.

The measurement, exposure, development, alignment measurement and pattern transfer operations S1, S2, S3, S4 form a cycle which may be performed a plurality of times as required according to the desired structure on the substrate W. The results of each measurement operation S1, S5 may be automatically stored in the database by an automatic storer. In this way a history of deformation of the substrate W may be built up during its processing. This allows process engineers to identify which of the plurality of exposure, development and process operations S2, S4 results in unallowable amounts of deformation of the substrate W.

The first measurement operation before the substrate W has been exposed may be performed without a comparison to a database. In this circumstance, no deformation of the substrate W would have occurred due to exposure or process because no exposure or process has yet occurred.

In some cases it may be advantageous in the comparing operation to only compare values stored in the database which come from substrates W of the same batch of substrates W. It may be that substrates of different batches react in differing ways to given exposure, development and processing operations, such that only values from the same batch of substrates would form a valid comparison. The activation of the operator alerter could indicate to the operator either a drift in the settings of the lithographic projection apparatus or a substrate W which has been subjected to too large a deformation.

The values in the database may be values of previous measuring operations S1, S5 on the particular substrate W under consideration. If a comparison shows deformation between cycles, or overall, beyond a predetermined value, the operator alerter may be activated or the exposure operation S2 controlled by the controller to account for the deformation.

The controller can control the exposure operation S2 to account for position offset or non-orthogonal deformation (automatically or by alerting an operator to make a manual correction) or even higher order deformations (i.e. non-linear deformations).

Figure 4:
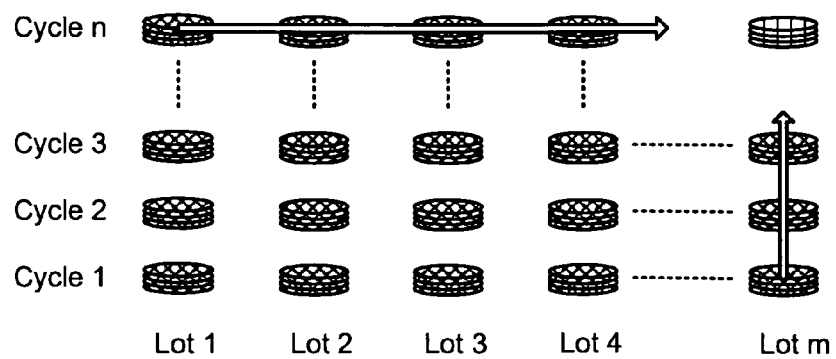
FIG. 4 shows the use of cycle fingerprint data and substrate data to make predictions.

FIG. 4 shows how fingerprint data relating to a particular cycle (e.g., cycle n), averaged over a number of lots and substrate data averaged over the substrate of a given lot (e.g., lot m), can be used to predict the results of the particular cycle on the given lot.

A statistical method of identifying discrepant substrates uses linear regression analysis based on the following model:

$$\Delta = \beta_0 + \beta_1 x + \beta_2 y + \text{residual}$$

where $\Delta$ is the difference between a measured position and the expected position in (x,y,z). In general the model fit is not perfect, which will result in a residual for each measurement. This residual can be thought of to consist of two components: a so-called non-correctable component and a random component. The non-correctable component is a constant that, by definition, cannot be described by the model applied. The random component, which may also be referred to as measurement noise, consists of real measurement-device related noise and, for example, of random variation in the quality of the measurement targets.

In practice multiple linear regression is applied to a number of entities, where an entity might be a substrate containing multiple alignment measurements of multiple substrates per batch or lot. Therefore modeling substrate data will result in a residual for each measurement position. By averaging the residuals for each measurement over all substrates an estimate is obtained of the non-correctable error of that position. In the event of a process change, an error such as a particle on the substrate table, or a layer-to-layer interaction, the pattern of the non-correctable errors will change and can readily be detected.

By using a method according to at least one embodiment of the invention as described herein, substrate deformation during manufacture can be monitored without a reduction in throughput because the operation of measuring the relative positions of the reference marks takes less time than the exposure operation and in some cases needs to be carried out in any case in order to gauge the positioning of the substrate relative to the protocol which is used in the exposing operation. Such a method may be used to allow the effects of process operations carried out on other tools to be monitored in the lithographic apparatus used for patterning.

If the result of the comparison is greater than a predetermined maximum, an operator may be alerted. This can improve yield for the customer as substrates which have deformed beyond a certain amount will be rejected before further exposing, developing and processing operations are carried out. Furthermore, during development of a multi-operation process for the manufacture of a device using lithography, those operations which cause unacceptable substrate deformation can be identified at an early stage. Embodiments of the invention may be used to alert a user of the apparatus if the apparatus drifts such that sub-standard substrates are being manufactured.

The information may comprise any kind of data relating to the substrate in general and/or to the particular layer of concern, as well as statistical measures. For example, the information may comprise raw position data; raw sensor data indicative of the substrate markers; and/or calculations from the data, such as magnification, translation, rotation or differences of individual measurements with respect to a reference grid described by parameters.

If the information stored in the database includes results of previous measuring operations, it is possible to accept or reject a substrate dependent on the deviation from the average measurement results or to highlight a change in processing conditions or a problem with the apparatus or processing conditions. Preferably in such a case the information is results of previous measuring operations on substrates of the same batch of substrates so that it is known that those substrates have all undergone the same processing. Of course, other comparisons may be made. For example, the information in the database used for the comparison may be values from the same layer in a different batch of wafers. A batch or lot is a set of wafers subjected to the same operations.

Preferably, a method according to an embodiment of the invention comprises the operation of automatically storing the result of the said measuring and/or comparing operations in said database so that a history of results is saved. This may be useful as a diagnosis tool for engineers investigating a particular process with a view to optimizing yield.

It is also possible to control the exposing operation dependant on the results of the comparing operation of the preceding cycle. Thus, the exposing operation can be controlled to take account of the deformation of the substrate which has been measured, thereby to ensure that the exposing operation exposes the substrate in such a way to account for the deformation present in the substrate.

While specific embodiments of the invention have been described above, it will be appreciated that the invention may be practiced otherwise than as described. Embodiments of the invention also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. A method of characterizing a process operation performed on a substrate having thereon a plurality of reference marks, the method comprising:
   exposing a pattern representing a layer of functional parts of a device onto a photosensitive layer provided on the substrate to create a latent pattern;
   developing said latent pattern in the photosensitive layer to reveal said pattern;
   subsequent to said developing, processing the substrate to form the functional parts;
   measuring relative positions of the reference marks on the processed substrate; and
   comparing a result of said measuring with reference information relating to nominal positions of the reference marks to characterize deformation of said substrate due to said processing,
   wherein characterizing deformation of said substrate comprises calculating a residual using a linear regression model of a difference between the results of said measuring and the reference information.

2. The method according to claim 1, wherein characterizing deformation of said substrate further comprises at least one of the group consisting of detecting a deformation of the substrate and measuring a deformation of the substrate.

3. The method according to claim 1, said method comprising obtaining said reference information, wherein said obtaining includes measuring relative positions of the reference marks on the substrate prior to said processing.

4. The method according to claim 1, wherein operations of applying a photosensitive layer, exposing a pattern onto the photosensitive layer to create a latent pattern, developing the latent pattern, and processing are carried out on a plurality of substrates in a batch,
   said method comprising obtaining said reference information, wherein said obtaining includes measuring relative positions of the reference marks on a first one of the substrates, and using said reference information to perform at least one of the group consisting of (1) detecting a deformation of at least one other substrate of said batch and (2) measuring a deformation of at least one other substrate of said batch.

5. The method according to claim 1, said method comprising:
   exposing a pattern representing a layer of functional parts of a device onto a photosensitive layer provided on another substrate to create a latent pattern; developing said latent pattern in the photosensitive layer on the other substrate to reveal said pattern;
   based upon said measuring and comparing, processing the other substrate.

6. The method according to claim 1, said method comprising:
   exposing a second pattern representing a layer of functional parts of a device onto a second photosensitive layer provided on the substrate to create a second latent pattern;
   developing said second latent pattern in the second photosensitive layer to reveal said second pattern;
   processing the substrate;
   wherein said exposing a second pattern is based upon said comparing.

7. The method according to claim 1, said method comprising automatically storing in a database a result of at least one of the group consisting of said measuring and said comparing.

8. The method according to claim 1, wherein said processing the substrate comprises transferring said pattern to the substrate.

9. The method according to claim 1, wherein said processing the substrate comprises modifying a process layer formed on the substrate.

10. The method according to claim 9, wherein said processing the substrate includes a chemical mechanical polishing process.

11. A device manufacturing method comprising:
    providing a beam of radiation using an illumination system;
    using patterning structure to impart the beam of radiation with a pattern in its cross-section, said pattern including alignment marks and functional parts of a device layer;
    projecting the patterned beam onto a target portion of a substrate to create a latent pattern;
    developing said latent pattern to reveal said pattern;
    subsequent to said developing, processing the substrate to form the functional parts;
    measuring relative positions of reference marks on the processed substrate; and
    comparing the results of said measuring with reference information relating to nominal positions of the reference marks to characterize deformation of said substrate due to said processing,
    wherein characterizing deformation of said substrate comprises calculating a residual using a linear regression model of a difference between the results of said measuring and the reference information.

12. A data storage medium storing machine-executable instructions, said instructions describing the method of claim 1.

13. A method of characterization, the method comprising:
    creating a latent pattern in a photosensitive layer provided on a substrate, said creating including exposing a pattern onto the photosensitive layer;
    developing said latent pattern;
    subsequent to said developing, processing the substrate;
    measuring positions of a plurality of reference marks on the processed substrate; and
    obtaining a characterization of deformation of said substrate due to said processing, wherein said characterization is based on a distance between nominal positions of the reference marks and the measured positions, wherein the characterizing of deformation of said substrate comprises calculating a residual using a linear regression model of a difference between the measured positions and the nominal positions of the reference marks.

14. The method according to claim 13, wherein said measuring positions includes measuring a position of at least one of the plurality of reference marks relative to at least another of the plurality of reference marks.

15. The method according to claim 13, wherein the pattern represents a layer of functional parts of a device.

16. The method according to claim 13, wherein said obtaining a characterization further comprises at least one of the group consisting of detecting a deformation of the substrate and measuring a deformation of the substrate.

17. The method according to claim 13, said method comprising obtaining the nominal positions of the reference marks, wherein said obtaining the nominal positions includes measuring relative positions of the plurality of reference marks prior to said processing.

18. The method according to claim 13, said method comprising:
developing a latent pattern created in a photosensitive layer provided on a second substrate;
subsequent to said developing, processing the second substrate; and
based on a result of said measuring, obtaining a characterization of deformation of said second substrate due to said processing the second substrate,
wherein said obtaining a characterization of deformation of said second substrate comprises at least one of the group consisting of (1) detecting a deformation of the second substrate and (2) measuring a deformation of the second substrate.

19. The method according to claim 13, said method comprising:
developing a latent pattern created in the photosensitive layer on a second substrate;
based upon said measuring and comparing, and subsequent to said developing a latent pattern created in the photosensitive layer on a second substrate, processing the second substrate.

20. The method according to claim 13, said method comprising:
exposing a second pattern onto a second photosensitive layer provided on the substrate to create a second latent pattern;
wherein said exposing a second pattern is based upon said comparing.

21. The method according to claim 13, said method comprising:
storing a result of at least one of the group consisting of said measuring and said comparing; and
based on said result, performing an operation on a different substrate.

22. The method according to claim 13, wherein said processing the substrate comprises altering a property of the substrate based on said developed latent pattern.

23. The method according to claim 13, wherein said processing the substrate comprises modifying a layer beneath the developed latent pattern.

24. The method according to claim 23, wherein said processing the substrate includes performing a chemical mechanical polishing process on the substrate.

25. The method according to claim 23, said method comprising:
providing a beam of radiation using an illumination system; and
using patterning structure to impart the beam of radiation with a pattern in its cross-section, said pattern including alignment marks and functional parts of a device layer,
wherein said exposing includes projecting the patterned beam onto a target portion of the substrate.

26. A data storage medium storing machine-executable instructions, said instructions describing a method of characterization, said method comprising:
creating a latent pattern in a photosensitive layer provided on a substrate, said creating including exposing a pattern onto the photosensitive layer;
developing said latent pattern;
subsequent to said developing, processing the substrate;
measuring positions of a plurality of reference marks on the processed substrate; and
obtaining a characterization of deformation of said substrate due to said processing, wherein said characterization is based on a distance between nominal positions of the reference marks and the measured positions,
wherein the characterizing of deformation of said substrate comprises calculating a residual using a linear regression model of a difference between the measured positions and the nominal positions of the reference marks.

27. The medium according to claim 26, wherein said obtaining a characterization further comprises at least one of the group consisting of detecting a deformation of the substrate and measuring a deformation of the substrate.

28. The medium according to claim 26, said method comprising obtaining the nominal positions of the reference marks, wherein said obtaining the nominal positions includes measuring relative positions of the plurality of reference marks prior to said processing.

29. The medium according to claim 26, said method comprising:
developing a latent pattern created in a photosensitive layer provided on a second substrate;
subsequent to said developing, processing the second substrate; and
based on a result of said measuring, obtaining a characterization of deformation of said second substrate due to said processing the second substrate,
wherein said obtaining a characterization of deformation of said second substrate comprises at least one of the group consisting of (1) detecting a deformation of the second substrate and (2) measuring a deformation of the second substrate.

30. The medium according to claim 26, said method comprising:
exposing a second pattern onto a second photosensitive layer provided on the substrate to create a second latent pattern;
wherein said exposing a second pattern is based upon said comparing.

31. The medium according to claim 26, said method comprising:
storing a result of at least one of the group consisting of said measuring and said comparing; and
based on said result, performing an operation on a different substrate.

* * * * *